(12) United States Patent
Fang et al.

(10) Patent No.: US 10,109,521 B1
(45) Date of Patent: Oct. 23, 2018

(54) METHOD TO PREVENT COBALT RECESS

(71) Applicant: GLOBALFOUNDRIES Inc., Grand Cayman (KY)

(72) Inventors: Qiang Fang, Ballston Lake, NY (US); Shafaat Ahmed, Ballston Lake, NY (US); Changhong Wu, Rexford, NY (US); Zhiguo Sun, Halfmoon, NY (US); Jiehui Shu, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/606,895

(22) Filed: May 26, 2017

(51) Int. Cl.
*H01L 23/48* (2006.01)
*H01L 21/768* (2006.01)
*H01L 23/532* (2006.01)

(52) U.S. Cl.
CPC .. *H01L 21/76843* (2013.01); *H01L 21/76802* (2013.01); *H01L 21/76861* (2013.01); *H01L 23/53238* (2013.01)

(58) Field of Classification Search
CPC ......... H01L 21/76843; H01L 21/76802; H01L 21/76846; H01L 21/76856; H01L 21/76861; H01L 23/53238; H01L 23/53266

USPC .......................................................... 257/752
See application file for complete search history.

(56) References Cited

U.S. PATENT DOCUMENTS

| 9,224,675 | B1 * | 12/2015 | DeHaven | .............. H01L 23/481 |
| 2013/0270703 | A1 * | 10/2013 | Zierath | ............. H01L 21/76877 |
| | | | | 257/751 |
| 2014/0287577 | A1 * | 9/2014 | Emesh | .............. H01L 21/76879 |
| | | | | 438/618 |

* cited by examiner

*Primary Examiner* — Tu-Tu Ho
(74) *Attorney, Agent, or Firm* — Ditthavong & Steiner, P.C.

(57) ABSTRACT

A method of forming hybrid Co and Cu CA/CB contacts and the resulting device are provided. Embodiments include forming a forming a plurality of trenches through an ILD down to a substrate; forming a first metal liner on side and bottom surfaces of each trench and over the ILD; annealing the first metal liner; forming a second metal liner over the first metal liner; forming a first plating layer over a portion of the second metal liner in each trench; forming a second plating layer over the second metal liner and first plating layer in a remaining portion of each trench, the first and second plating layers being different materials; and planarizing the second plating layer and the second and first metal liners down to the ILD.

11 Claims, 8 Drawing Sheets

METHOD TO PREVENT COBALT RECESS

TECHNICAL FIELD

The present disclosure relates to the manufacture of semiconductor devices with cobalt (Co) source/drain (CA) and gate (CB) contacts.

BACKGROUND

Co metallization for CA/CB contacts is key for advanced technology node and beyond. In particular, Co has a void-free gap fill capability comparable with traditionally used tungsten (W), but offers a low resistance gain compared to W. However, known Co chemical mechanical planarization (CMP) processes have limited ability to achieve a recess-free Co CA/CB formation with Co plating. In addition, current W CA schemes are not compatible with leading post-etch cleaning processes. As illustrated in FIG. 1A (cross-sectional view), a titanium (Ti) and titanium nitride (TiN) liner 101 is formed on the side and bottom surfaces of trenches 103 and over the interlayer dielectric (ILD) 105 that is formed on the substrate 107. The Ti/TiN liner 101 is then annealed by a dynamic surface annealing (DSA) process. Thereafter, a Co liner 109 is formed over the Ti/TiN liner 101 by chemical vapor deposition (CVD). A Co plating layer 111 is then formed in each trench 103 and over the Co liner 109. Adverting to FIG. 1B, a bulk and buff CMP process is performed to planarize the Co plating layer 111 down to the ILD 105 and to remove the Ti/TiN liner 101 and Co liner 109, respectively, from over the ILD 105. However, during the CMP process, the Co liner and plating layer 109 and 111, respectively, are recessed prior to the formation of a silicon carbon nitride (SiCN) capping layer (not shown for illustrative convenience).

A need therefore exists for methodology enabling the formation of Co-based CA/CB contacts without subsequent Co recess or incompatibility with leading post-etch cleaning processes and the resulting device.

SUMMARY

An aspect of the present disclosure is a method of forming hybrid Co and copper (Cu) CA/CB contacts.

Another aspect of the present disclosure is a device having hybrid Co and Cu CA/CB contacts.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a plurality of trenches through an ILD down to a substrate; forming a first metal liner on side and bottom surfaces of each trench and over the ILD; annealing the first metal liner; forming a second metal liner over the first metal liner; forming a first plating layer over a portion of the second metal liner in each trench; forming a second plating layer over the second metal liner and first plating layer in a remaining portion of each trench, the first and second plating layers being different materials; and planarizing the second plating layer and the second and first metal liners down to the ILD.

Aspects of the present disclosure include the first metal liner including tantalum nitride (TaN) and tantalum (Ta). Further aspects include the second metal liner and the first plating layer including Co. Another aspect includes the portion of the second metal liner having a depth of 2 nm to 50 nm. Further aspects include the remaining portion of each trench having a depth of 10 nm to 100 nm. Additional aspects include the second plating layer including Cu. Other aspects include forming a cap layer over the substrate. Additional aspects include the cap layer including SiCN. Further aspects include forming the first metal liner by a radio frequency physical vapor deposition (RFPVD).

Another aspect of the present disclosure is a device including: a plurality of trenches in an ILD over a substrate; a first metal liner on sidewalls and a bottom surface of each trench; a second metal liner over the first metal liner; a first plating layer filling a portion of each trench; and a second plating layer filling a remaining portion of each trench, the first and second plating layers being different materials.

Aspects of the device include the first metal liner including TaN and Ta. Another aspect includes the second metal liner and the first plating layer including Co. Other aspects include the portion of each trench having a depth of 2 nm to 50 nm. A further aspect includes the remaining portion of each trench having a depth of 10 nm to 100 nm. Another aspect includes the second plating layer including Cu. Other aspects include a cap layer over the ILD, first and second metal liners, and the second plating layer. A further aspect includes the cap layer including SiCN.

A further aspect of the present disclosure is a method including: forming a plurality of trenches through an ILD to a substrate; forming a TaN and Ta liner on side and bottom surfaces of each trench and over the ILD; annealing the TaN/Ta liner; forming a Co liner over the TaN/Ta liner; forming a Co plating layer over a portion of the Co liner in each trench; forming a Cu plating layer over the Co liner and Co plating layer in a remaining portion of each trench; and planarizing the Cu plating layer, Co liner, and TaN/Ta liner down to the ILD.

Aspects of the present disclosure include the remaining portion of each trench having a depth of 10 nm to 100 nm. Another aspect includes forming a SiCN cap layer over the substrate.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of Co recess and incompatibility with leading post-etch cleaning processes attendant upon forming Co CA/CB contacts. The problems are solved, inter alia, by forming Cu plating over partially formed Co CA/CB contacts to prevent Co recess during subsequent CMP and cleaning steps.

Methodology in accordance with embodiments of the present disclosure includes forming a plurality of trenches through an ILD down to a substrate. A first metal liner is formed on the side and bottom surfaces of each trench and over the ILD, and is then annealed. A second metal liner is formed over the first metal liner. A first plating layer is then formed over a portion of the second metal liner in each trench. A second plating layer is formed over the second metal liner and first plating layer in a remaining portion of each trench, the first plating layer and the second plating layer being different materials. Then, the second plating layer and the second and first metal liners are planarized down to the ILD.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
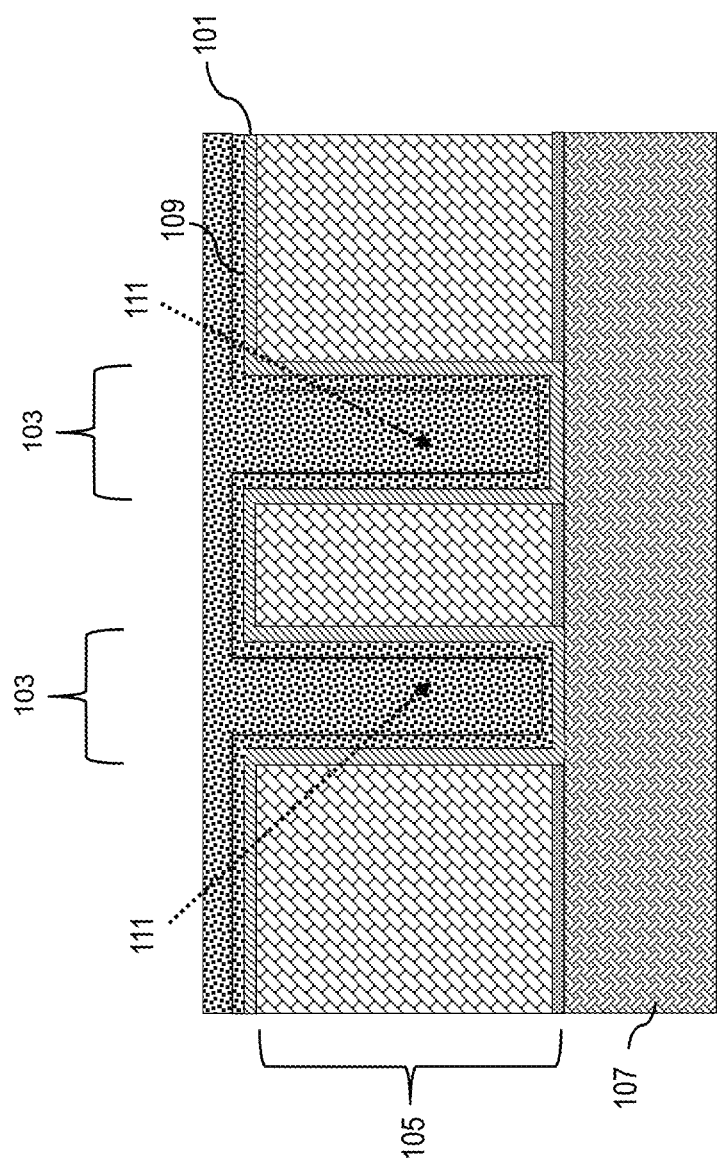
FIG. 1A through 1B schematically illustrate cross-sectional views of a background process flow for forming Co CA/CB contacts.
Figure 1B:
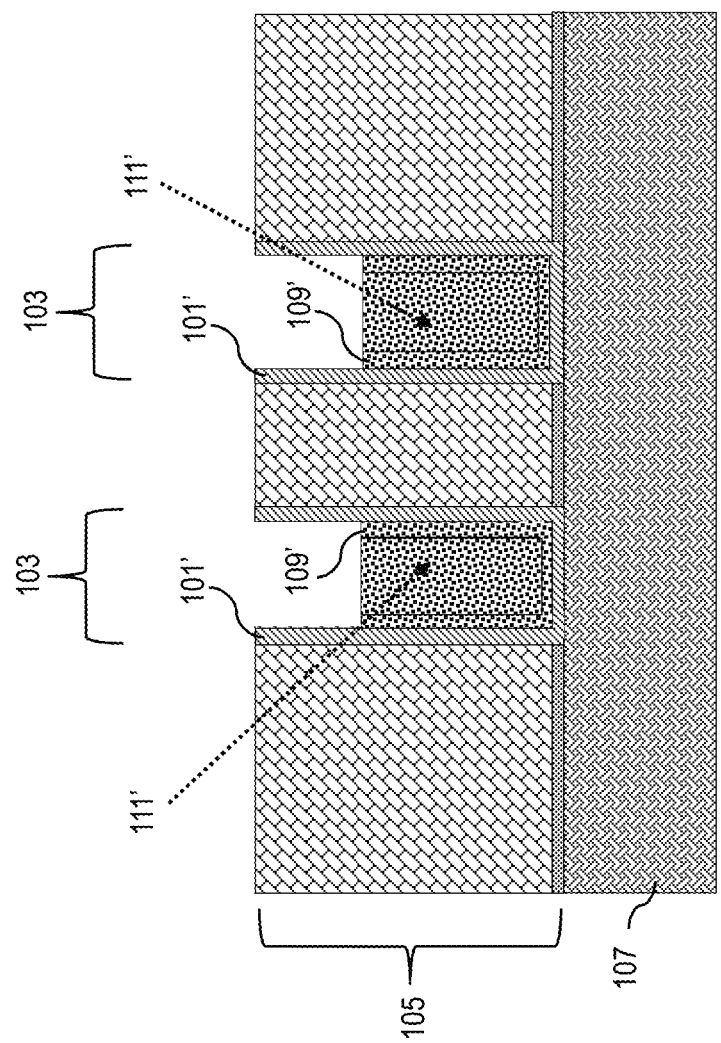
Figure 2A:
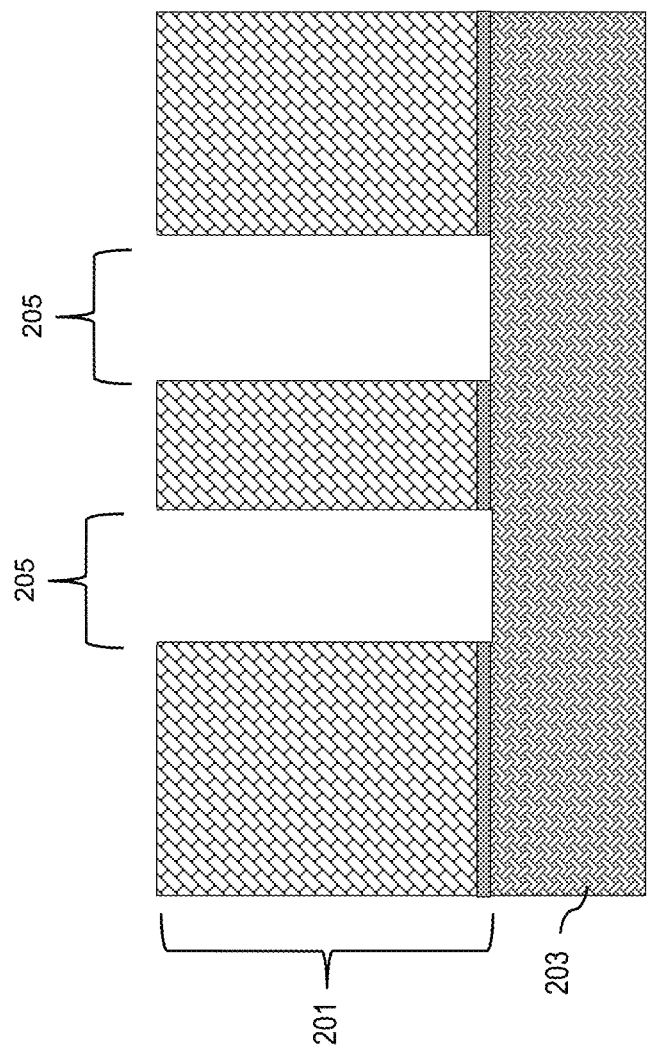
FIG. 2A through 2F schematically illustrate a process flow for forming hybrid Co and Cu CA/CB contacts, in accordance with an exemplary embodiment.
Figure 2B:
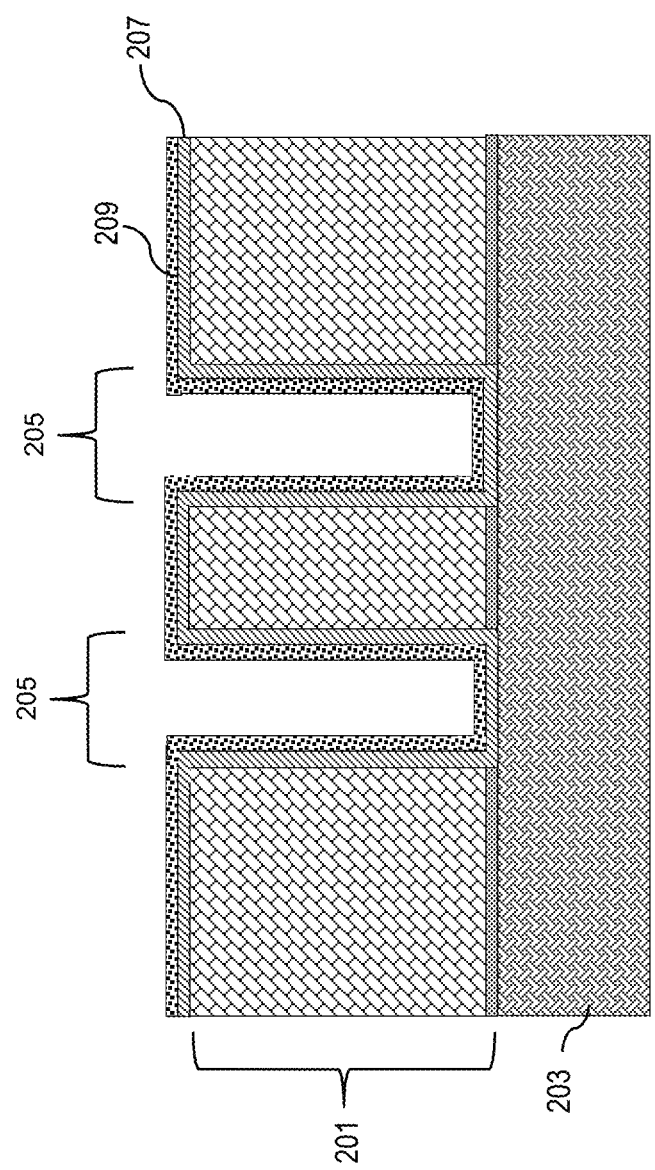

FIG. 2A through 2F schematically illustrate cross-sectional views of a process flow for hybrid Co and Cu CA/CB contacts, in accordance with an exemplary embodiment. Adverting to FIG. 2A, an ILD 201 is formed, e.g., with a thickness of 50 nm to 100 nm, over a Si substrate 203 and then trenches 205, e.g., each having a width of 20 nm to 38 nm, are formed through the ILD 201 by etching. A metal liner 207 is then formed, e.g., of TaN and Ta, on the side and bottom surfaces of trenches 205 and over the ILD 201 by RFPVD, as depicted in FIG. 2B. The metal liner 207 may be formed, e.g., to a thickness of 2 nm to 4 nm. Next, the metal liner 207 is annealed by a DSA process. A Co liner 209 is then formed, e.g., to a thickness of 1 nm to 5 nm, over the metal liner 207 by CVD.

Figure 2C:
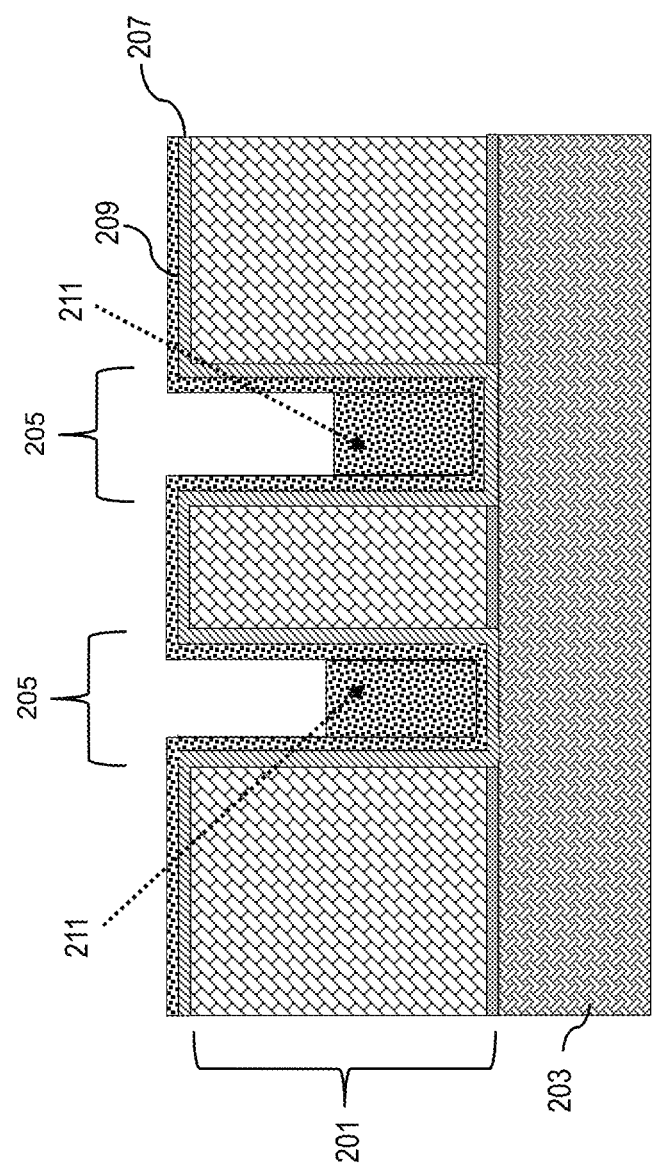
Figure 2D:
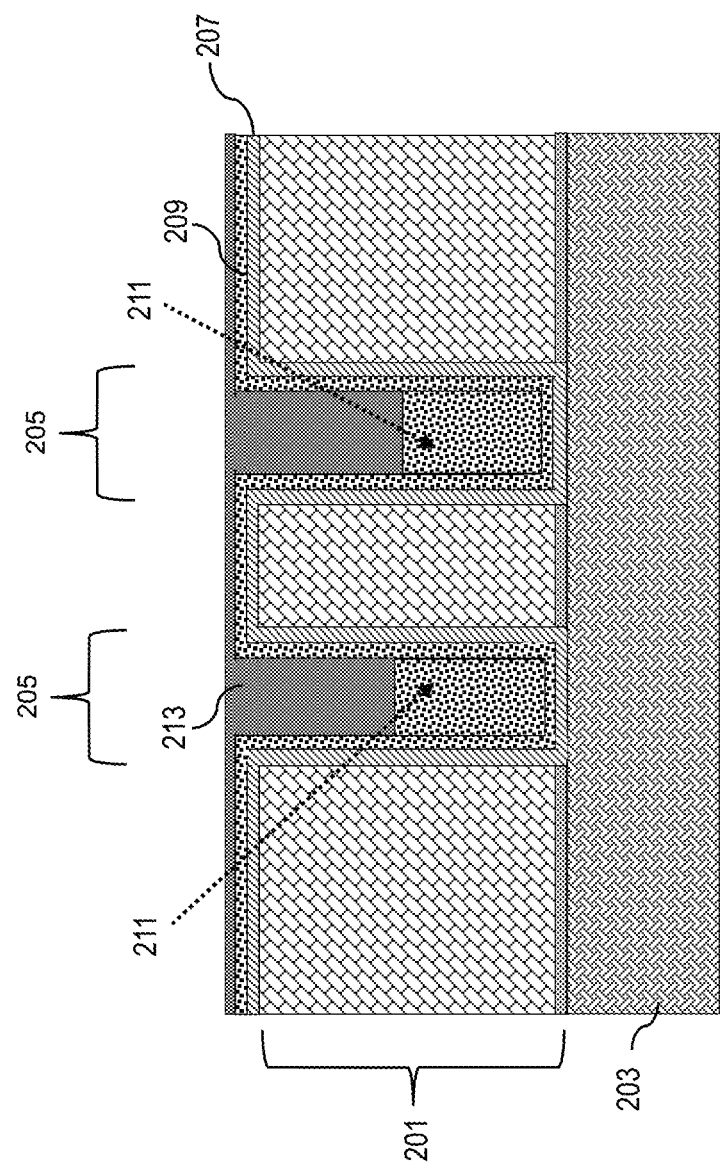
Figure 2E:
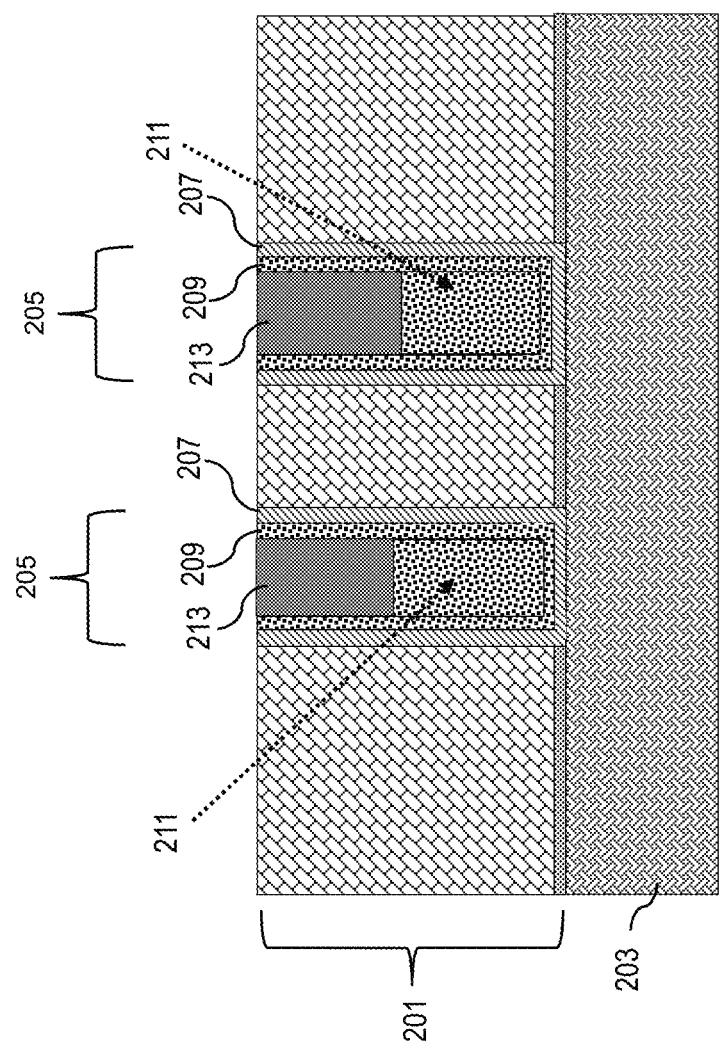
Figure 2F:
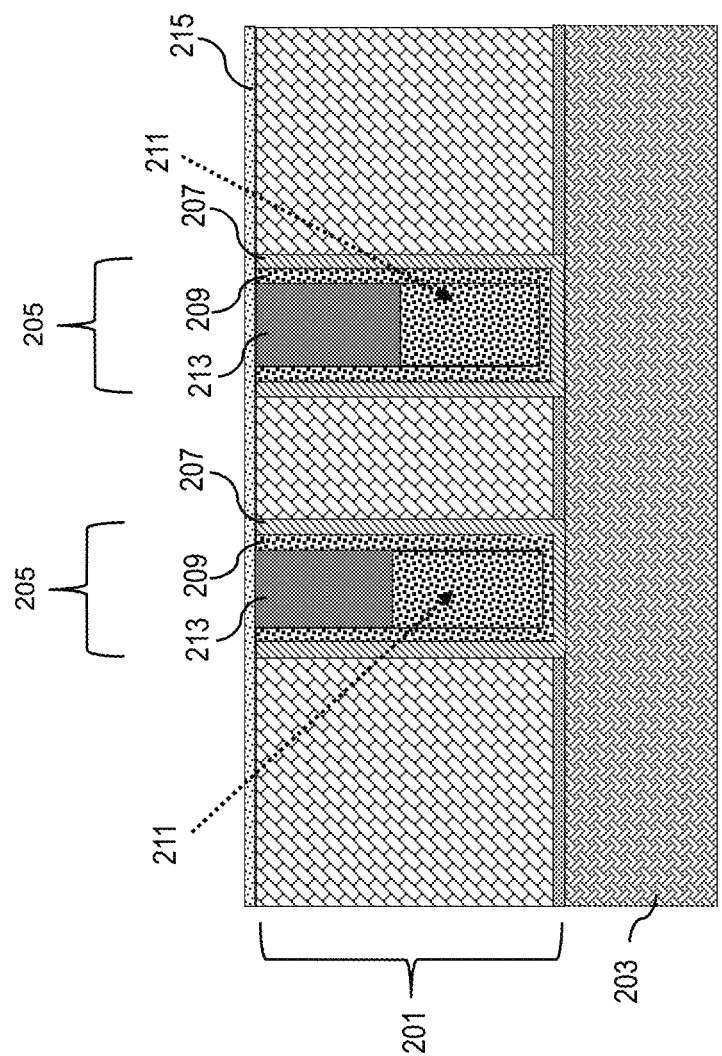

As illustrated in FIG. 2C, a Co plating layer 211 is formed, e.g., to a depth of e.g., 10 nm to 100 nm, over a portion of the Co liner 209 in each of the trenches 205. A Cu plating layer 213 is then formed over the Co liner 209 and the Co plating layer 211, filling the remainder of each trench 205, as depicted in FIG. 2D. Adverting to FIG. 2E, the Cu plating layer 213, the Co liner 209 and metal liner 207 are then planarized by CMP down to the ILD 201. Thereafter, an optional cap layer 215 is formed, e.g., of SiCN to a thickness of 10 nm to 18 nm, over the substrate 203 and planarized, e.g., by CMP.

The embodiments of the present disclosure can achieve several technical effects including preventing Co recess during subsequent CMP and cleaning process, reducing metal resistance compared to known Co CA/CB contact formation processes, and being compatible with leading post-etch cleaning processes due to partial replacement of Co with Cu. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any IC devices with Co-based CA/CB contacts, particularly for the 7 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming a plurality of trenches through an interlayer dielectric (ILD) down to a substrate;
    forming a first metal liner on side and bottom surfaces of each trench and over the ILD, the first metal liner comprises tantalum nitride (TaN) and tantalum (Ta);
    annealing the first metal liner;
    forming a second metal liner over the first metal liner;
    forming a first plating layer over a portion of the second metal liner in each trench;
    forming a second plating layer over the second metal liner and first plating layer in a remaining portion of each trench, the first and second plating layers being different materials; and
    planarizing the second plating layer and the second and first metal liners down to the ILD.

2. The method according to claim 1, wherein the second metal liner and the first plating layer comprise cobalt (Co).

3. The method according to claim 1, wherein the portion of the second metal liner comprises a depth of 2 nanometer (nm) to 50 nm.

4. The method according to claim 1, wherein the remaining portion of each trench comprises a depth of 10 nm to 100 nm.

5. The method according to claim 1, wherein the second plating layer comprises copper (Cu).

6. The method according to claim 1, further comprising forming a cap layer over the substrate.

7. The method according to claim 6, wherein the cap layer comprises silicon carbon nitride (SiCN).

8. The method according to claim 1, comprising forming the first metal liner by a radio frequency physical vapor deposition (RFPVD).

9. A method comprising:

forming a plurality of trenches through an interlayer dielectric (ILD) to a substrate;

forming a tantalum nitride (TaN) and tantalum (Ta) liner on side and bottom surfaces of each trench and over the ILD;

annealing the TaN/Ta liner;

forming a cobalt (Co) liner over the TaN/Ta liner;

forming a Co plating layer over a portion of the Co liner in each trench;

forming a copper (Cu) plating layer over the Co liner and Co plating layer in a remaining portion of each trench; and planarizing the Cu plating layer, Co liner, and TaN/Ta liner down to the ILD.

10. The method according to claim 9, wherein the remaining portion of each trench comprises a depth of 10 nanometer (nm) to 100 nm.

11. The method according to claim 9, further comprising forming a silicon carbon nitride (SiCN) cap layer over the substrate.

* * * * *